(12) United States Patent
Kim

(10) Patent No.: US 9,059,275 B2
(45) Date of Patent: Jun. 16, 2015

(54) SEMICONDUCTOR DEVICE

(71) Applicant: SK hynix Inc., Gyeonggi-do (KR)

(72) Inventor: Dae-Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 13 days.

(21) Appl. No.: 13/728,254

(22) Filed: Dec. 27, 2012

(65) Prior Publication Data

US 2014/0061787 A1 Mar. 6, 2014

(30) Foreign Application Priority Data

Aug. 31, 2012 (KR) .................. 10-2012-0096623

(51) Int. Cl.
*H01L 29/66* (2006.01)
*H01L 29/78* (2006.01)
*H01L 29/06* (2006.01)
*H01L 29/08* (2006.01)

(52) U.S. Cl.
CPC ...... *H01L 29/7816* (2013.01); *H01L 29/66689* (2013.01); *H01L 29/0653* (2013.01); *H01L 29/0878* (2013.01)

(58) Field of Classification Search
CPC ............... H01L 29/6659; H01L 29/66704; H01L 29/66681; H01L 29/7801; H01L 29/7824; H01L 29/66613; H01L 29/7816; H01L 29/0852
USPC .............. 257/328, 343, 335, 272, 339, 409; 438/197
See application file for complete search history.

(56) References Cited

U.S. PATENT DOCUMENTS

| | | | |
|---|---|---|---|
| 6,906,381 B2 | 6/2005 | Peyre-Lavigne et al. | |
| 7,968,936 B2 | 6/2011 | Denison et al. | |
| 2006/0278924 A1* | 12/2006 | Kao | 257/339 |
| 2009/0256199 A1* | 10/2009 | Denison et al. | 257/343 |
| 2010/0102388 A1* | 4/2010 | Levin et al. | 257/343 |

* cited by examiner

*Primary Examiner* — Jae Lee
*Assistant Examiner* — Junaiden Mirsalahuddin
(74) *Attorney, Agent, or Firm* — IP & T Group LLP

(57) ABSTRACT

The present invention provides a semiconductor device that ensures both the breakdown voltage characteristic and specific on-resistance characteristic required for a high-voltage semiconductor device and that includes a gate over a substrate, a source region formed at one side of the gate, a drain region formed at the other side of the gate, and a plurality of device isolation films formed between the source region and the drain region, below the gate.

10 Claims, 8 Drawing Sheets

US 9,059,275 B2

SEMICONDUCTOR DEVICE

CROSS-REFERENCE TO RELATED APPLICATIONS

The present application claims priority of Korean Patent Application No. 10-2012-0096623, filed on Aug. 31, 2012, which is incorporated herein by reference in its entirety.

BACKGROUND

1. Field

Exemplary embodiments of the present invention relate to semiconductor device fabrication technology, and, more particularly, to a high-voltage MOS transistor.

2. Description of the Related Art

A laterally double-diffused MOS (LDMOS) transistor that is a high voltage MOS transistor is advantageous over a bipolar transistor, because the LDMOS transistor has a high input impedance and power gain, and a circuit for driving the same is very simple. In addition, because the LDMOS transistor is a unipolar device, it is advantageous that the LDMOS transistor is free from the delay caused by minority carrier recombination in a turn-off operation. For these reasons, the LDMOS transistor is widely used in various power devices, including integrated circuits (ICs), power converters, motor controllers and automotive power devices.

FIG. 1 is a cross-sectional view showing a laterally double-diffused MOS (LDMOS) transistor according to the prior art. FIG. 1 illustrates a structure in which two N-channel lateral double-diffused MOS transistors are disposed symmetrically with respect to a bulk pick-up region on a substrate.

Referring to FIG. 1, the N-channel lateral double-diffused MOS transistor according to the prior art includes an N-type deep well 12 formed on a P-type substrate 11, both an N-well 14 and P-well 16 formed in the N-type deep well 12, both an N-type source region 17 and a P-type bulk pick-up region 18 formed in the P-well 16, an N-type drain region 15 formed in the N-type well 14, a gate electrode 20 formed over the substrate 11 between the end of the N-type source region 17 and before the N-type drain region 15, and an insulating layer 21 interposed between the gate electrode 20 and the P-type substrate 11. Herein, the insulating layer 21 includes a gate insulating film 19 and a field oxide film 13.

As it is well known in the art, a process of designing a high-voltage MOS transistor basically requires the minimization of the specific on-resistance (Rsp) of the transistor while maintaining the breakdown voltage (BV) at a high level.

Methods used to increase the breakdown voltage (BV) of the high-voltage MOS transistor in the prior art include reducing the impurity doping concentration of an impurity region (e.g., N-type deep well 12) corresponding to a drift region D, increasing the length of the field oxide film 13 to increase the length of the drift region D, or introducing a P-type impurity layer into the N-type deep well 12 corresponding to the drift region D. For reference, a region in which the gate electrode 20 overlaps with the P-well 16 acts as the channel region C, and a region ranging from the end of the channel region C to the drain region 15 is referred to as the drift region D.

However, the above-described methods inevitably involve an increase in the specific on-resistance (Rsp) of the N-channel lateral double-diffused MOS transistor, thereby reducing the specific on-current of the transistor. On the contrary, to decrease the specific on-resistance of the transistor, when the impurity doping concentration of an impurity region corresponding to the drift region D is increased or the length of the drift region D is reduced, the breakdown voltage (BV) characteristic of the transistor will be deteriorated.

As described above, the breakdown voltage (BV) characteristic and the specific on-resistance (Rsp) characteristic have a trade-off relationship. Thus, there is an urgent need for a method that may sustain both the breakdown voltage (BV) and specific on-resistance (Rsp) characteristics required for a high-voltage MOS transistor.

SUMMARY

Exemplary embodiments of the present invention are directed to a semiconductor device that may sustain both the breakdown voltage and specific on-resistance characteristics required for a high-voltage MOS transistor.

In accordance with an exemplary embodiment of the present invention, a semiconductor device may include a gate formed over a substrate, a source region formed at one side of the gate, a drain region formed at the other side of the gate, and a plurality of device isolation films formed between the source region and the drain region, below the gate.

In accordance with another exemplary embodiment of the present invention, a semiconductor device may include a second-conductivity-type deep well formed over a substrate, a first-conductivity-type well formed in the second-conductivity-type deep well, a gate formed over the substrate so as to partially overlap with the first-conductivity-type well, a second-conductivity-type source region formed in the first-conductivity-type well, at one side of the gate, a second-conductivity-type drain region in the second-conductivity-type deep well, at the other side of the gate, and a plurality of device isolation films formed in the second-conductivity-type deep well, below the gate.

In accordance with another exemplary embodiment of the present invention, a semiconductor device may include a first-conductivity-type substrate, a first-conductivity-type first well and second-conductivity-type second well formed over the first-conductivity-type substrate, a gate formed over the first-conductivity-type substrate so as to overlap with the first-conductivity-type first well and the second-conductivity-type second well, a second-conductivity-type source region formed in the first-conductivity-type first well, at one side of the gate, a second-conductivity-type drain region formed in the second-conductivity-type second well, at the other side of the gate, and a plurality of device isolation films formed in the second-conductivity-type second well, below the gate.

DETAILED DESCRIPTION

Figure 1:
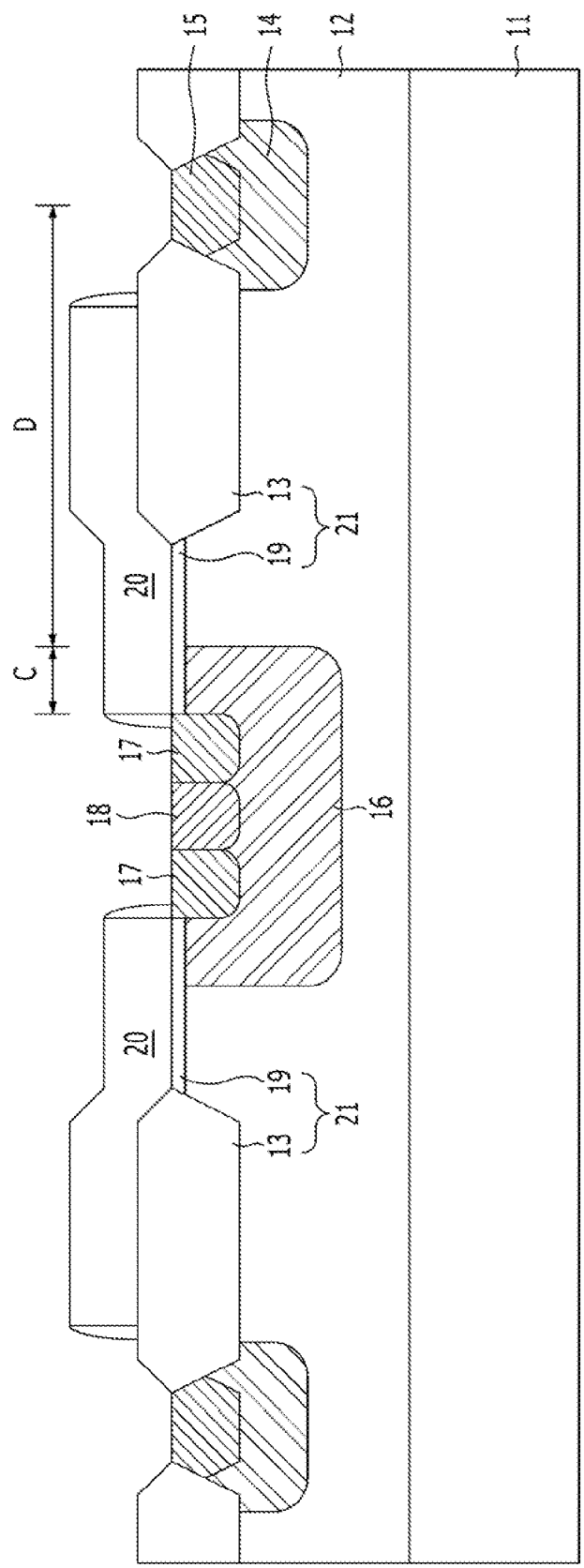
FIG. 1 is a cross-sectional view showing a lateral double-diffused MOS transistor according to the prior art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, fully conveying the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

The following exemplary embodiments of the present invention provide a semiconductor device that may sustain both the breakdown voltage (BV) and specific on-resistance (Rsp) characteristics required for a high-voltage MOS transistor. The semiconductor device according to the embodiments of the present invention is characterized as a device isolation film overlapping a gate electrode that is divided into a plurality of portions so that the E-field between the gate electrode and the drain region is induced to increase the breakdown voltage of the device while an accumulation layer is induced between the plurality of device isolation films to decrease the specific on-resistance (Rsp) of the device.

Hereinafter, a description will be made by an example of an N-channel lateral double-diffused MOS (LDMOS) transistor to which the feature of the present invention has been applied. Thus, in the following description, a first conductivity type corresponds to a P type, and a second conductivity type corresponds to an N type. In the case of the feature of the present invention being applied to a P-channel lateral double-diffused MOS transistor, a first conductivity type corresponds to an N type, and a second conductivity type corresponds to a P type.

Figure 2:
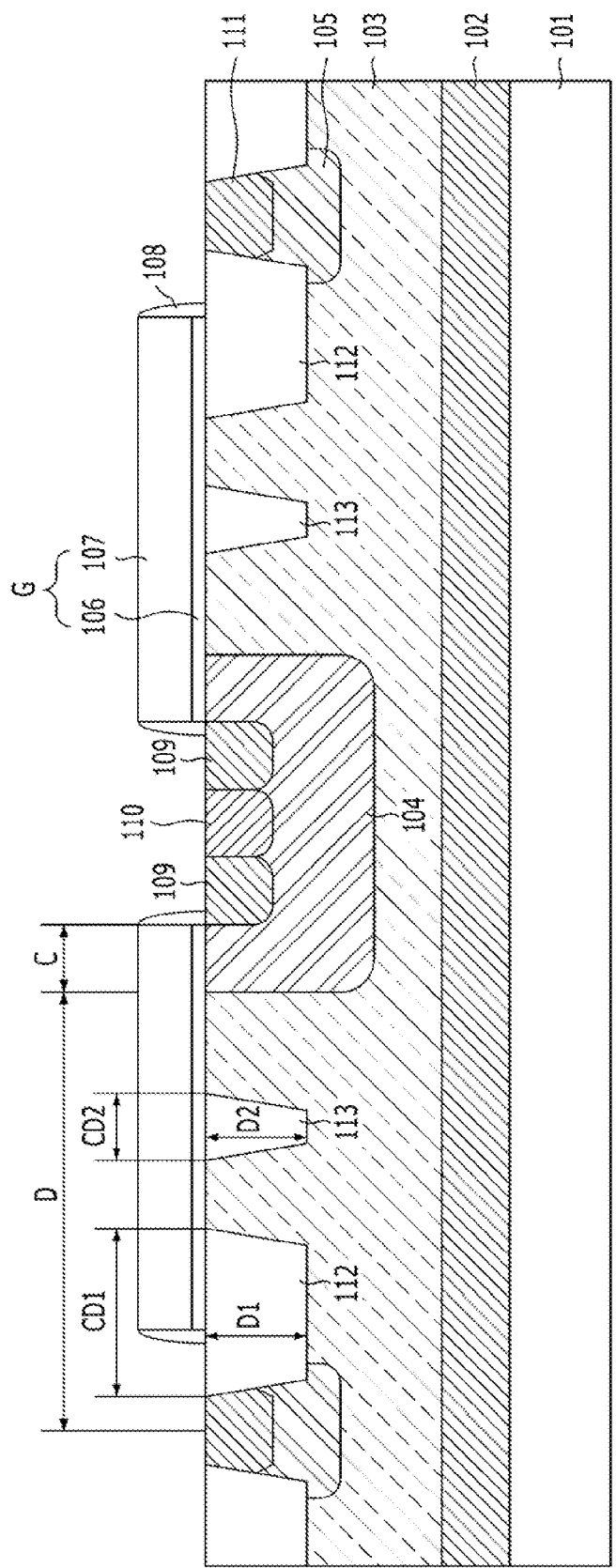
FIG. 2 is a cross-sectional view showing a lateral double-diffused MOS transistor according to a first exemplary embodiment of the present invention.

FIG. 2 is a cross-sectional view showing a lateral double-diffused MOS transistor according to a first exemplary embodiment of the present invention. FIG. 2 illustrates a structure in which two N-channel lateral double-diffused MOS transistors are disposed symmetrically with respect to a bulk pick-up region on a substrate.

As shown in FIG. 2, a lateral double-diffused MOS transistor according to a first exemplary embodiment of the present invention includes a second-conductivity-type deep well 103 and a second-conductivity-type buried impurity layer 102 formed over a substrate 101, a first-conductivity-type first well 104 formed in the second-conductivity-type deep well 103, a couple of second-conductivity-type source regions 109 and a first-conductivity-type bulk pick-up region 110 formed in the first-conductivity-type first well 104, a second-conductivity-type second well 105 formed in the second-conductivity-type deep well 103, a second-conductivity-type drain region 111 formed in the second-conductivity-type second well 105, a gate G formed on the substrate 101, and a plurality of device isolation films 112 and 113 below the gate G formed in the second-conductivity-type deep well 103. Herein, a region where the first-conductivity-type first well 104 overlaps the gate G acts as a channel region C, and a region ranging from the sidewall of the first-conductivity-type first well 104 below the gate G in the second-conductivity-type deep well 103 to the second-conductivity-type drain region 111 is referred to as a drift region D.

The substrate 101 may include single crystalline silicon. Thus, the substrate 101 may be a SOI (silicon-on-insulator) substrate consisting of a bulk silicon substrate or support substrate, a buried insulating layer, and an epitaxial layer (e.g., epitaxial silicon layer), all sequentially deposited in that order. Alternatively, the substrate 101 may be a substrate doped with a first-conductivity-type impurity.

The second-conductivity-type deep well 103 may have an impurity doping concentration lower than those of the first-conductivity-type well 104, the second-conductivity-type second well 105, or the second-conductivity-type buried impurity layer 102 to improve the breakdown voltage characteristic of the device. Thus, when the impurity doping concentration of the second-conductivity-type deep well 103 is reduced in such a manner that the specific on-resistance characteristic of the device is not deteriorated, the breakdown voltage characteristic of the device may be improved.

The second-conductivity-type buried impurity layer 102 is located under the second-conductivity-type deep well 103 and serves to prevent a depletion region from extending excessively from the first-conductivity-type first well 104 the second-conductivity-type second well 105 in the substantially perpendicular direction with respect to the length of the substrate 101, thereby improving the breakdown voltage characteristic of the device. For this purpose, the impurity doping concentration of the second-conductivity-type buried impurity layer 102 may be higher than those of the second-conductivity-type deep well 103, the first-conductivity-type first well 104 or the second-conductivity-type second well 105.

The first-conductivity-type first well 104 and the second-conductivity-type second well 105 are spaced at a predetermined interval from each other in the horizontal direction with respect to the length of the substrate 101. Herein, the interval between the first-conductivity-type first well 104 and the second-conductivity-type second well 105 may correspond to the length of the drift region D. The impurity doping concentrations of the first-conductivity-type first well 104 or the second-conductivity-type second well 105 may be higher than that of the second-conductivity-type deep well 103.

The gate G formed over the substrate 101 may be a stack of a gate insulating film 106 and a gate electrode 107. The gate insulating film 106 may be any one selected from the group consisting of an oxide film, a nitride film, an oxynitride film, and stacks thereof. The thickness of the gate insulating film 106 may be controlled by an operating voltage. The gate electrode 107 may include a semiconductor film such as a silicon film or a silicon-germanium film, and/or a metallic film such as a metal film, a metal oxide film, a metal nitride film or a metal silicide film. In addition, a spacer 108 is formed on the sidewall of the gate G. The spacer 108 includes an insulating film.

The couple of second-conductivity-type source regions 109 are formed in the first-conductivity-type first well 104 so as to be aligned with one side of the gate G, and the first-conductivity-type bulk pick-up region 110 is formed between the second-conductivity-type source regions 109 in the first-conductivity-type first well 104. Each second-conductivity-type source region 109 may have a lightly doped drain (LDD) structure, and the first-conductivity-type bulk pick-up region 110 may have an impurity doping concentration higher than the first well 104. The second-conductivity-type drain region 111 is formed at a distance from the other side of the gate G, and the second-conductivity-type drain region 111 is formed in the second-conductivity-type second well 105. The impurity doping concentration of the second-conductivity-type drain region 111 may be higher than that of the second-conductivity-type second well 105.

The plurality of device isolation films 112 and 113 is formed in the second-conductivity-type deep well 103 with distance from each other and below the gate G. Each of the device isolation films 112 and 113 may include a structure formed by a shallow trench isolation (STI) process. The structure formed by the STI process has an advantage that the depth, linewidth and spacing may be easily controlled compared to a field oxide film formed by a LOCOS (local oxidation of silicon) process according to the prior art. Thus, when the STI process is used, the plurality of device isolation films 112 and 113 may be more effectively formed in a limited space compared to a field oxide film formed by the LOCOS process.

The device isolation film 112, alternatively referred to as a first device isolation film 112, and the device isolation film 113, alternatively referred to as a second device isolation film 113, may be disposed at predetermined intervals from each other in the horizontal direction with respect to the length of the substrate 101. Among the plurality of device isolation films 112 and 113, the first device isolation film 112 disposed closest to the second-conductivity-type drain region 111 is formed in contact with the second-conductivity-type drain region 111. Thus, the first device isolation film 112 formed in contact with the second-conductivity-type drain region 111 may overlap with a portion of the gate G. Herein, the first device isolation film 112 formed in contact with the second-conductivity-type drain region 111 is preferably formed to have the larger linewidth and depth among the plurality of device isolation films 112 and 113. This improves the breakdown voltage characteristic of the device while dispersing an electric field because the part of the gate insulating film 106 formed over the second-conductivity-type deep well 103 between the first device isolation film 112 and the second device isolation film 113 may resist the set breakdown voltage.

The plurality of device isolation films 112 and 113 may have the same linewidth, or the linewidth thereof may decrease gradually in accordance with the direction from the second-conductivity-type drain region 111 toward the second-conductivity-type source region 109. Specifically, the first device isolation film 112 and the second device isolation film 113 have a first linewidth CD1 and a second linewidth CD2, respectively, in which the first linewidth CD1 and the second linewidth CD2 may be the same, or the second linewidth CD2 may be shorter than the first linewidth CD1.

The plurality of device isolation films 112 and 113 may have a depth greater than the second-conductivity-type source region 109 and greater than the second-conductivity-type drain region 111 with respect to the surface of the substrate 101. The plurality of device isolation films 112 and 113 may have a depth less than the first-conductivity-type first well 104 and less than the second-conductivity-type second well 105. Also, the plurality of device isolation films 112 and 113 may have the same depth as or the depth thereof may decrease gradually in accordance with the direction from the second-conductivity-type drain region 111 toward the second-conductivity-type source region 109. Specifically, the first device isolation film 112 and the second device isolation film 113 have a first depth D1 and a second depth D2, respectively, in which the depth of the first depth D1 and the second depth D2 may be the same, or the depth of the second depth D2 may be shorter than that of the first depth D1.

According to the above-described first exemplary embodiment of the present invention, the plurality of device isolation films 112 and 113 are formed below the gate G in the second-conductivity-type deep well 103 and thus the breakdown voltage characteristic and specific on-resistance characteristic of the device may be simultaneously improved.

Hereinafter, detailed description will be made on the principle of the present invention in which the breakdown voltage characteristic and specific on-resistance characteristic of the device may be simultaneously improved by forming the plurality of device isolation films 112 and 113.

In the present invention, breakdown voltage refers to a voltage measured between the second-conductivity-type drain region 111 and the second-conductivity-type source region 109 that is in a state in which a high voltage is applied to the second-conductivity-type drain region 111 and a ground voltage is applied to the gate G. Due to the high voltage applied to the second-conductivity-type drain region 111, a deletion region extends from the second-conductivity-type drain region 111, while an E-field increases. In the prior art as shown in FIG. 1, because one field oxide film (or device isolation film) was formed between the N-type drain region 15 and the N-type source region 17, the generated E-field was concentrated on the N-type source region 17 from the drain region 15, thereby deteriorating the breakdown voltage characteristic of the device.

However, in the embodiment of the present invention, an E-field is formed between the second-conductivity-type drain region 111 and the portion of the gate G that is formed adjacent to the second-conductivity-type deep well 103 between the plurality of device isolation films 112 and 113. Thus, the E-field generated between the second-conductivity-type drain region 111 and the gate G may relieve the E-field caused by a depletion region extending from the second-conductivity-type drain region 111, thereby dispersing the generated E-field that is concentrated on the second-conductivity-type source region 109 to the second-conductivity-type drain region 111, thereby improving the breakdown voltage characteristic of the device.

Accordingly, the breakdown voltage characteristic of the device may be improved without reducing the impurity doping concentration of an impurity region (e.g., second-conductivity-type deep well 103) corresponding to the drift region D, unlike the prior art. Thus, the specific on-resistance characteristic of the device due to a decrease in the impurity doping concentration of the second-conductivity-type deep well 103 may be prevented from deteriorating. In addition, the breakdown voltage characteristic of the device may be improved without increasing the length of the drift region D (i.e., without increasing the length of a field oxide film or device isolation film). Thus, the current path may be prevented from increasing that may be due to an increase in the length of the drift region D, thereby preventing deterioration in the specific on-resistance characteristic. In addition, the breakdown voltage characteristic of the device may be improved by introducing an impurity layer with a different conductivity type into an impurity region (e.g., second-conductivity-type deep well 103) corresponding to the drift region D. Thus, the number of process steps may be reduced by controlling the introduction of the impurity layer, and the specific on-resistance characteristic may be prevented from deteriorating that is caused by a potential barrier between the deep well 103 and the impurity layer that may have different conductivity types.

When a bias is applied to the gate G, a channel caused by an inversion layer is formed on the surface of the first-conductivity-type first well 104 overlapping the gate G, and an accumulation layer is formed on the surface of the second-conductivity-type deep well 103, overlapping the gate G and the surface of the plurality of device isolation films 112 and 113. Herein, the inversion layer and the accumulation layer act as current paths between the second-conductivity-type source region 109 and the second-conductivity-type drain region 111.

In the prior art as shown in FIG. 1, the current path by the accumulation between the N-type drain region 15 and the N-type source region 17 was formed as a planar structure along the bottom of the field oxide film. However, in the present invention, the plurality of device isolation films 112 and 113 exhibit the effect of widening the current path caused by the accumulation layer. Specifically, because the portion of the second-conductivity-type deep well 103 between the plurality of device isolation films 112 and 113 comes into contact with the gate insulation film 106, a portion of the accumulation layer with a conductivity higher than that of a portion of the accumulation layer formed on the surface of the plurality of device isolation films 112 and 113 but below the gate G is formed between the plurality of device isolation films 112 and 113 so that the current path caused by the accumulation layer widens. Therefore current transfer between the second-conductivity-type drain region 111 and the second-conductivity-type source region 109 is improved while the specific on-resistance of the device decreases.

As a result, according to the present invention, the plurality of device isolation films 112 and 113 are formed below the gate G in the second-conductivity-type deep well 103 between the second-conductivity-type drain region 111 and the second-conductivity-type source region 109, and thus the breakdown voltage characteristic of the device may be improved without having to use the prior art methods that inevitably involve an increase in specific on-resistance. At the same time, the current path may be widened by the plurality of device isolation films 112 and 113, thereby improving the specific on-resistance characteristic of the device.

Figure 3:
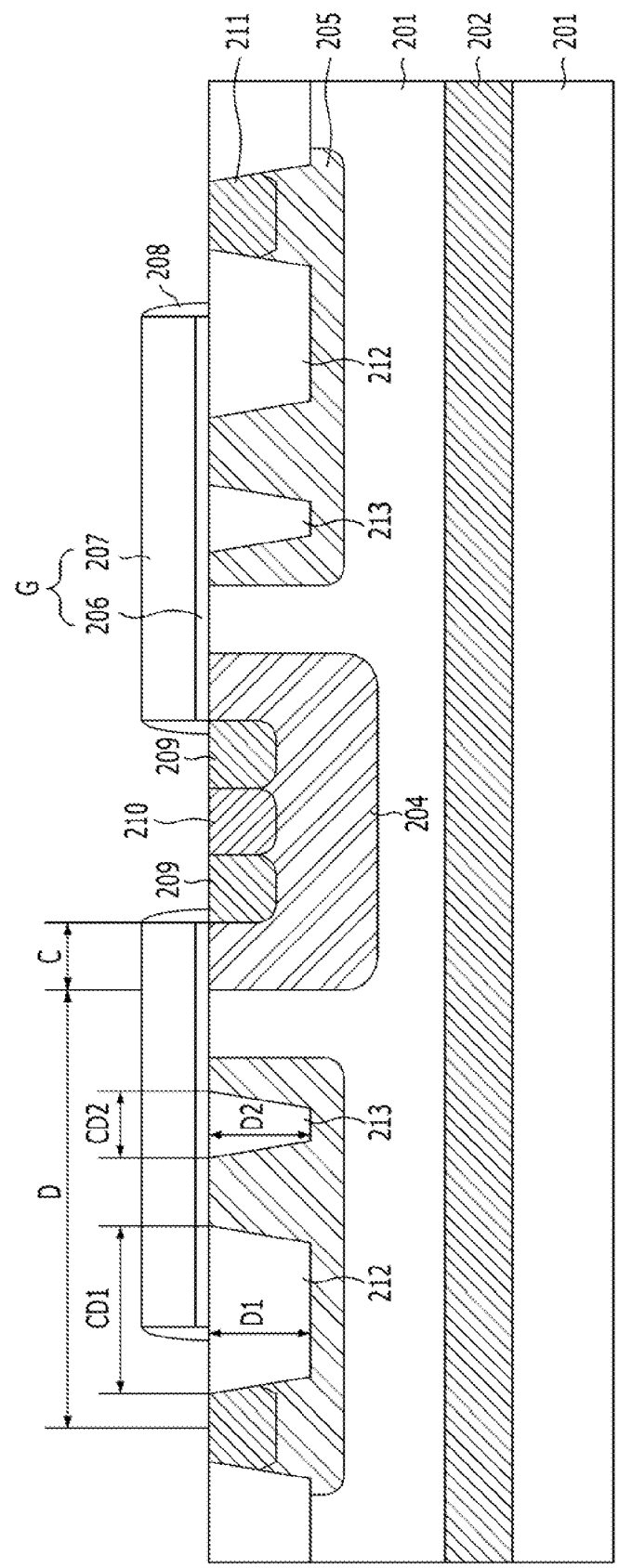
FIG. 3 is a cross-sectional view showing a laterally double-diffused MOS transistor according to a second exemplary embodiment of the present invention.

FIG. 3 is a cross-sectional view showing a lateral double-diffused MOS transistor according to a second embodiment of the present invention. FIG. 3 illustrates a structure in which two N-channel lateral double-diffused MOS transistors are disposed symmetrically with respect to a bulk pick-up region on a substrate.

As shown in FIG. 3, a lateral double-diffused MOS transistor according to a second exemplary embodiment of the present invention includes a buried impurity layer 202 formed on a first-conductivity-type substrate 201, a first-conductivity-type first well 204 formed in the first-conductivity-type substrate 201, a couple of second-conductivity-type source regions 209 and a first-conductivity-type bulk pick-up region 210 formed in the first-conductivity-type first well 204, a second-conductivity-type second well 205 formed in the first-conductivity-type substrate 201, a second-conductivity-type drain region 211 formed in the second-conductivity-type second well 205, a gate G formed on the first-conductivity-type substrate 201, and a plurality of device isolation films 212 and 213 below the gate G and in the second-conductivity-type second well 205. Herein, a region where the first-conductivity-type first well 204 overlaps the gate G acts as a channel region C, and a region ranging from the sidewall of the first-conductivity-type first well 204 below the gate G to the second-conductivity-type drain region 211 is referred to as a drift region D.

The substrate 201 may include single crystalline silicon. Thus, the substrate 201 may be a SOI (silicon-on-insulator) substrate consisting of a bulk silicon substrate or support substrate, a buried insulating layer and an epitaxial layer (e.g., epitaxial silicon layer), all sequentially deposited in that order.

The buried impurity layer 202 is located on the first-conductivity-type substrate 201 and serves to prevent a depletion region from extending excessively from the first-conductivity-type first well 204 and the second-conductivity-type second well 205 in an upward diagonal direction with respect to the length of the substrate 201 thereby improving the breakdown voltage characteristic of the device.

The first-conductivity-type first well 204 and the second-conductivity-type second well 205 may be disposed at a predetermined distance from each other in the horizontal direction with respect to the length of the substrate 201. Alternatively, they may also be disposed such that the sidewall of the first-conductivity-type first well 204 and the sidewall of the second-conductivity-type second well 205, which face each other, are adjacent to each other. When the first-conductivity-type first well 204 and the second-conductivity-type second well 205 are formed at a predetermined distance from each other in the horizontal direction with respect to the length of the substrate 201, the breakdown voltage characteristic of the device may be improved. When the first-conductivity-type first well 204 and the second-conductivity-type second well 205 are formed adjacent to each other, the specific on-resistance characteristic of the device may be improved.

The gate G formed on the substrate 201 may be a stack of a gate insulating film 205 and a gate electrode 207. The gate insulating film 206 may be any one selected from the group consisting of an oxide film, a nitride film, an oxynitride film, and stacks thereof. The thickness of the gate insulating film 206 may be controlled by a operating voltage. The gate electrode 207 may include a semiconductor film such as a silicon film or a silicon-germanium film, and/or a metallic film such as a metal film, a metal oxide film, a metal nitride film or a metal silicide film. In addition, a spacer 208 is formed on the sidewall of the gate G. The spacer 208 includes an insulating film.

The couple of second-conductivity-type source regions 209 are formed in the first-conductivity-type first well 204 so as to be aligned with one side of the gate G and the first-conductivity-type bulk pick-up region 210 is formed between the second-conductivity-type source regions 209 in the first-conductivity-type first well 204. Each second-conductivity-type source region 209 may have a lightly doped drain (LDD) structure, and the first-conductivity-type bulk pick-up region 210 may have an impurity doping concentration higher than the first-conductivity-type first well 204.

The second-conductivity-type drain region 211 is formed at a distance from the other side of the gate G, and the second-conductivity-type drain region 211 is formed in the second-conductivity-type second well 205. The impurity doping concentration of the second-conductivity-type drain region 211 may be higher than that of the second-conductivity-type second well 205.

The plurality of device isolation films 212 and 213 is formed in the second-conductivity-type second well 205 with distance from each other and below the gate G. Each of the device isolation films 212 and 213 may include a structure formed by an STI (shallow trench isolation) process. The structure formed by the STI process has an advantage that the depth, linewidth and spacing may be easily controlled compared to a field oxide film formed by a LOCOS (local oxidation of silicon) according to the prior art. Thus, when the STI process is used, the plurality of device isolation films 212 and 213 may be more effectively formed in a limited space compared to a field oxide film formed by the LOCOS process.

The device isolation film 212, alternatively referred to as a first device isolation film 212, and the device isolation film 213, alternatively referred to as a second device isolation film 213, may be disposed at predetermined intervals from each other in the horizontal direction with respect to the length of the substrate 201. Among the plurality of device isolation films 212 and 213, the first device isolation film 212 disposed closest to the drain region 211 is formed in contact with the second-conductivity-type drain region 211. Thus, the first device isolation film 212 formed in contact with the second-conductivity-type drain region 211 may overlap with a portion of the gate G. Herein, the first device isolation film 212 formed in contact with the second-conductivity-type drain region 211 is preferably formed to have the larger linewidth and depth among the plurality of device isolation films 212 and 213. This improves the breakdown voltage characteristic of the device while dispersing an electric field because the part of the gate insulating film 206 formed over the second-conductivity-type deep well 205 between the first device isolation film 212 and the second device isolation film 213 may resist the set breakdown voltage.

The plurality of device isolation films 212 and 213 may have the same linewidth, or the linewidth thereof may decrease gradually in accordance with the direction from the second-conductivity-type drain region 211 toward the second-conductivity-type source region 209. Specifically, the first device isolation film 212 and the second device isolation film 213 have a first linewidth CD1 and a second linewidth CD2, respectively, in which the first linewidth CD1 and the second linewidth CD2 may be the same, or the second linewidth CD2 may be shorter than the first linewidth CD1.

The plurality of device isolation films 212 and 213 may have a depth greater than the second-conductivity-type source region 209 and greater than the second-conductivity-type drain region 211 with respect to the surface of the substrate 201. The plurality of device isolation films 212 and 213 may have a depth less than the first-conductivity-type first well 204 and less than the second-conductivity-type second well 205. Also, the plurality of device isolation films 212 and 213 may have the same depth as, or the depth thereof may decrease gradually in accordance with the direction from the second-conductivity-type drain region 211 toward the second-conductivity-type source region 209. Specifically, the first device isolation film 212 and the second device isolation film 213 have a first depth D1 and a second depth D2, respectively, in which the depth of the first depth D1 and the second depth D2 may be the same, or the depth of the second depth D2 may be shorter than the first depth D1.

According to, the above-described second exemplary embodiment of the present invention, the plurality of device isolation films 212 and 213 are formed below the gate G in the second-conductivity-type second well 205, and thus the breakdown voltage characteristic and specific on-resistance characteristic of the device may be simultaneously improved.

FIGS. 4A to 4E are cross-sectional views showing a method for fabricating a lateral double-diffused MOS transistor according to one embodiment of the present invention. Hereinafter, one embodiment of a method for fabricating the lateral double-diffused MOS transistor having the structure shown in FIG. 2 will be described.

Figure 4A:
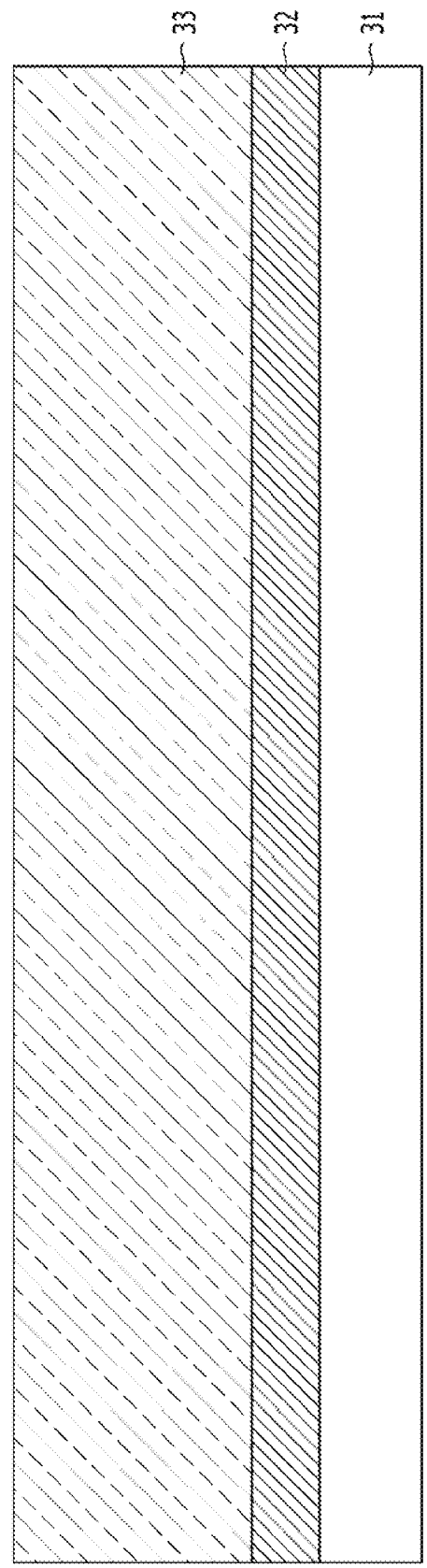
FIGS. 4A to 4E are cross-sectional views showing a method for fabricating a lateral double-diffused MOS transistor according to an exemplary embodiment of the present invention.

As shown in FIG. 4A, a substrate 31 is prepared. The substrate 31 may include single crystalline silicon. Thus, the substrate 31 may be a bulk silicon substrate or a SOI (silicon-on-insulator) substrate. The substrate 31 may be an undoped substrate or a substrate doped with a first-conductivity-type impurity.

Then, a second-conductivity-type buried impurity layer 32 and a second-impurity-type deep well 33 are sequentially formed on the substrate 31. They may be formed by an ion injection process in such a manner that the buried impurity layer 32 is located under the deep well 33. The buried impurity layer 32 may be formed to have an impurity concentration higher than that of the second-impurity-type deep well 33 in order to improve the breakdown voltage characteristic of the device.

Figure 4B:
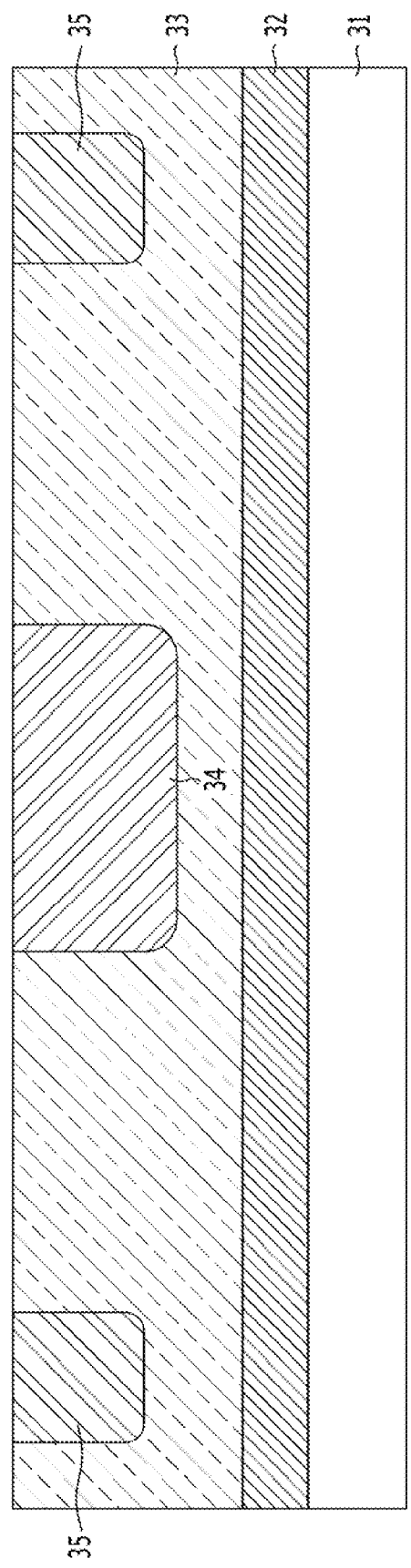

As shown in FIG. 4B, a first-conductivity-type first well 34 is formed in the second-impurity-type deep well 33. The first-conductivity-type first well 34 may be formed by a series of processes of forming a mask pattern (not shown) for opening regions that correspond to the source region, bulk pick-up region and channel region of the lateral double-diffused MO transistor, and then ion-injecting a first-conductivity-type impurity, and removing the mask pattern.

Then, a second-conductivity-type second well 35 is formed in the second-impurity-type deep well 33. The second-conductivity-type second deep well 35 may be formed by a series of processes of forming a mask pattern (not shown) on the substrate 31 for opening a region that corresponds to the drain region of the lateral double-diffused MOS transistor and then, ion-injecting a second-conductivity-type impurity, and removing the mask pattern.

Figure 4C:
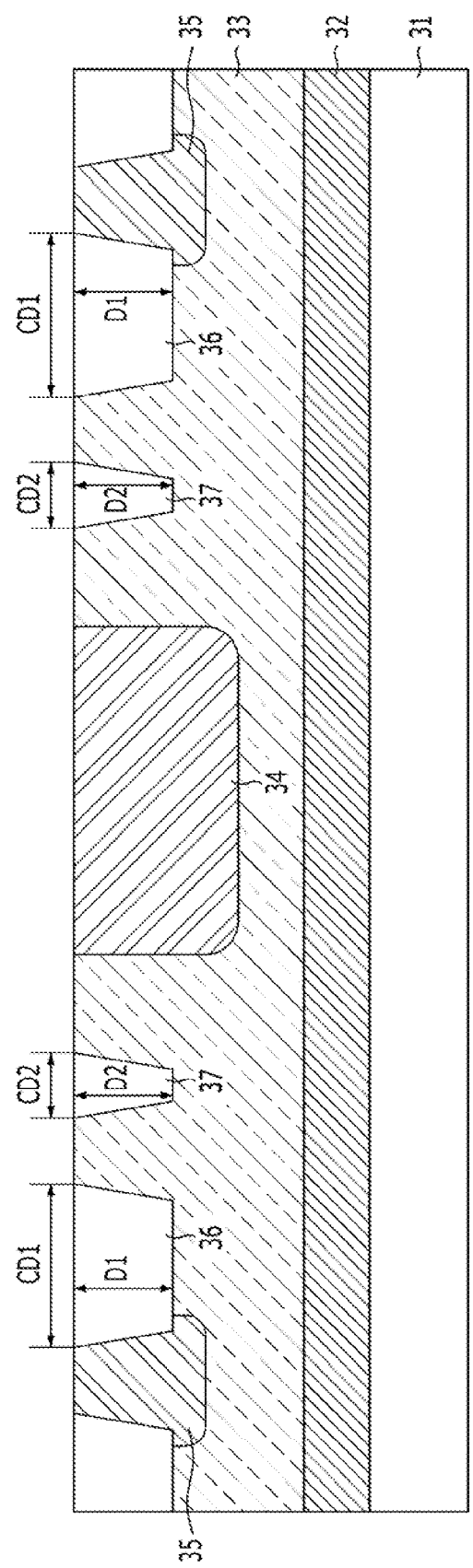
Figure 4D:
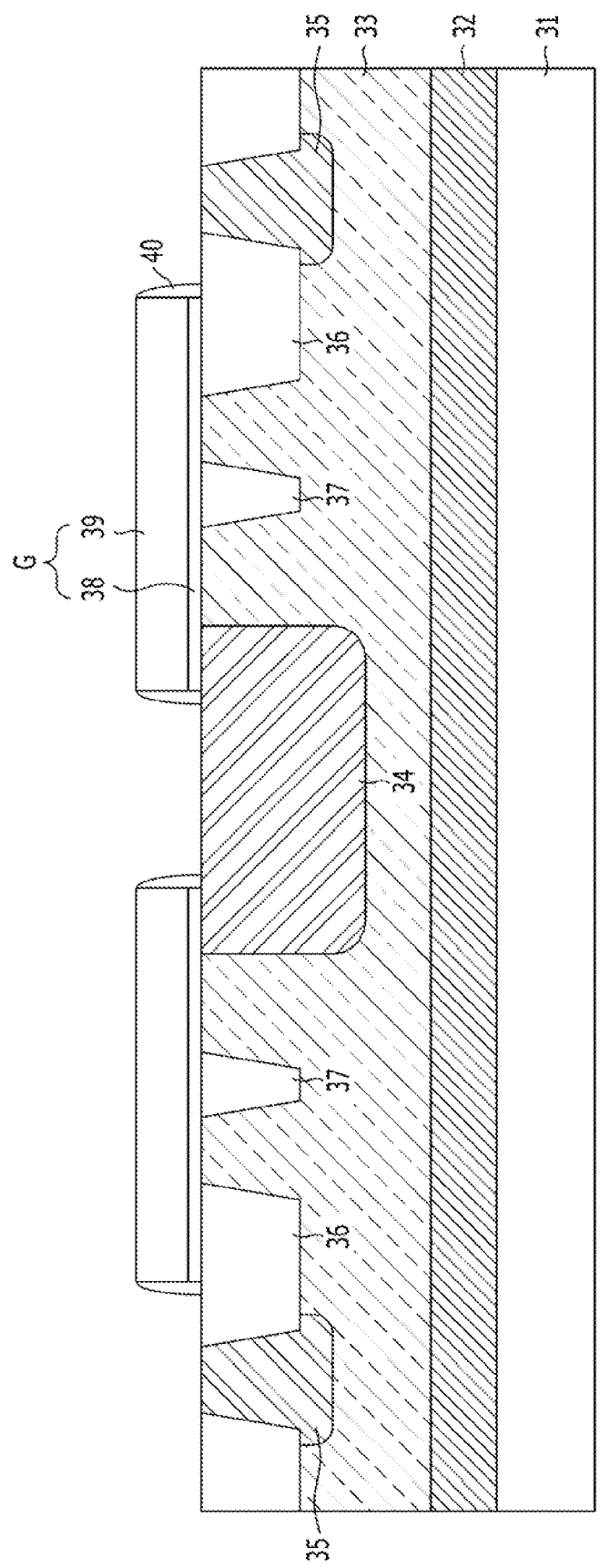

As shown in FIG. 4C, a plurality of device isolation films 36 and 37 are formed over the substrate 31 and is spaced at predetermined distances from each other in the horizontal direction with respect to the length of the substrate 31. The plurality of device isolation films 36 and 37 may be formed to have a depth less than that of the first-conductivity-type first wall 4 and less than that of the second-conductivity-type second well 35. The plurality of device isolation films 36 and 37 may be formed by a STI (shallow trench isolation) process. When the STI process is used, the depth, linewidth and spacing of the device isolation films may be easily controlled, compared to a field oxide film formed by a LOCOS (local oxidation of silicon) process according to the prior art.

The plurality of device isolation films 36 and 37 may be formed in an area corresponding to the drift region of the lateral double-diffused MOS transistor. The plurality of device isolation films 36 and 37 may be formed such that the device isolation films 36 and 37 may have the same linewidth or the linewidth thereof may decrease gradually in accordance with the direction from the second-conductivity-type second well 35 toward the first-conductivity-type first well 34. In addition, the plurality of device isolation films 36 and 37 may be formed such that the device isolation films 36 and 37 may have the same depth or the depth thereof may decrease gradually in accordance with the direction from the second-conductivity-type second well 35 toward the first-conductivity-type first well 34.

As shown in FIG. 40, a gate insulating film 38 and a gate conductive film are sequentially formed on the entire surface of the substrate 31, and then patterned to form a gate G consisting of a stack of a gate insulating film 38 and a gate electrode 39.

The gate G may be formed such that one end of the gate G overlaps with a portion of the first-conductivity-type first well 34 and the other end thereof is spaced at a predetermined distance from the second-conductivity-type second well 35 or overlaps with a portion of the second-conductivity-type second well 35. In addition, the plurality of device isolation films 36 and 37 is formed to locate below the gate G.

Then, a spacer 40 is formed on both sidewalls of the gate G.

Figure 4E:
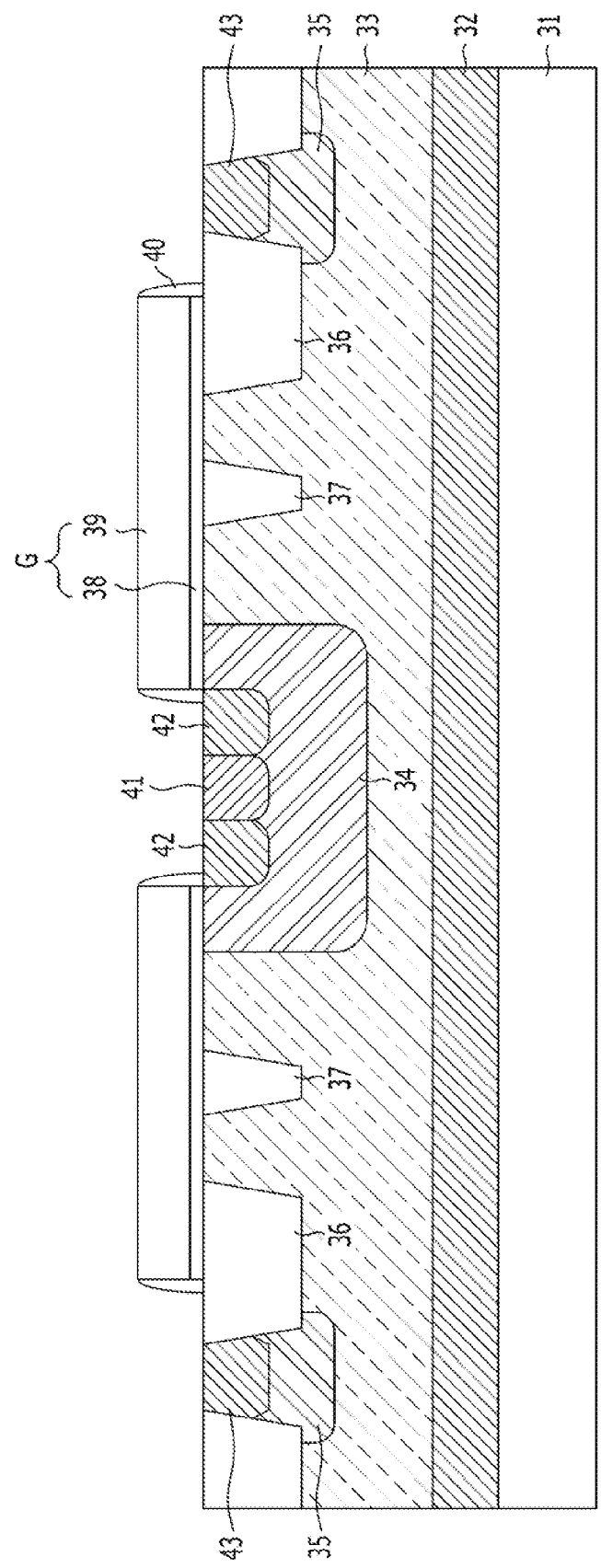

As shown in FIG. 4E, a first-conductivity-type bulk pick-up region 41 and a plurality of second-conductivity-type source regions 42 are formed in the first-conductivity-type first well 34, and a second-conductivity-type drain region 43 is formed in the second-conductivity-type second well 35. The first-conductivity-type bulk pick-up region 41, the plurality of the second-conductivity-type source regions 42 and the second-conductivity-type drain region 43 may be formed by an ion injection process such that the bottoms thereof are higher than the bottoms of the device isolation films 36 and 37.

Then, interlayer insulating films, metal wirings and the like are formed in a manner similar to a known CMOS process, thereby fabricating a semiconductor device.

In the above embodiments of the present invention, the structure comprising two device isolation films has been described by a way of example. However, two or more device isolation films are also possible, if they can be designed and embodied within a determined space.

In addition in the above embodiments of the present invention, the application of the technical feature of the present invention to a lateral double-diffused MOS transistor has been described by way of example. However, the technical field of the present invention may be applied to all types of high-voltage semiconductor devices, including high-voltage MOS transistors, such as lateral double-diffused MOS transistors or EDMOS (extended drain MOS) transistors.

As described above, according to the embodiments of the present invention, the breakdown voltage and specific on-resistance characteristics of the semiconductor device may be simultaneously improved by forming a plurality of device isolation films between the source region and the drain region located below the gate.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a gate formed over a substrate; a source region formed at one side of the gate;
a drain region formed at the other side of the gate; and a plurality of device isolation films formed between the source region and the drain region, wherein the plurality of device isolation films are formed below the gate and among the plurality of device isolation films, the device isolation film located closest to the drain region overlaps with a portion of the gate, wherein the device isolation film located closest to the drain region has the largest linewidth and depth among the plurality of device isolation films.

2. The semiconductor device of claim 1, wherein the plurality of device isolation films have a linewidth thereof that decreases gradually in accordance with the direction from the drain region toward the source region.

3. The semiconductor device of claim 1, wherein the plurality of device isolation films have a depth thereof that decreases gradually in accordance with the direction from the drain region toward the source region.

4. The semiconductor device of claim 1, wherein the plurality of device isolation films comprise a structure formed by a shallow trench isolation (STI) process.

5. A semiconductor device comprising:
a second-conductivity-type deep well formed over a substrate;
a first-conductivity-type well formed in the second-conductivity-type deep well;
a gate formed over the substrate so as to partially overlap with the first-conductivity-type well;
a second-conductivity-type source region formed in the first-conductivity-type well, at one side of the gate;
a second-conductivity-type drain region in the second-conductivity-type deep well, at the other side of the gate; and
a plurality of device isolation films formed in the second-conductivity-type deep well, wherein the plurality of device isolation films are formed below the gate and among the plurality of device isolation films, the device isolation film located closest to the drain Legion overlaps with a portion of the gate, wherein the device isolation film located closest to the drain region has the largest linewidth and depth among the plurality of device isolation films.

6. The semiconductor device of claim 5, wherein the plurality of device isolation films have a linewidth thereof that decreases gradually in accordance with the direction from the drain region toward the source region.

7. The semiconductor device of claim 5, wherein the plurality of device isolation films have a depth thereof that decreases gradually in accordance with the direction from the drain region toward the source region.

8. The semiconductor device of claim 5, wherein the plurality of device isolation films comprise a structure formed by a shallow trench isolation (STI) process.

9. The semiconductor device of claim 1, wherein the plurality of device isolation films comprise a first device isolation film and a second device isolation film, and wherein the first device isolation film is formed between the source and the second device isolation film, and the second device isolation film is formed between the first device isolation film and the drain region.

10. The semiconductor device of claim 5, wherein the plurality of device isolation films comprise a first device isolation film and a second device isolation film, and wherein the first device isolation film is formed between the source and the second device isolation film, and the second device isolation film is formed between the first device isolation film and the drain region.

\* \* \* \* \*